United States Patent
Pekin et al.

(10) Patent No.: US 6,700,207 B2
(45) Date of Patent: Mar. 2, 2004

(54) FLIP-CHIP BALL GRID ARRAY PACKAGE FOR ELECTROMIGRATION TESTING

(75) Inventors: Senol Pekin, San Jose, CA (US); Anand Govind, San Jose, CA (US); Carl Iwashita, San Carlos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/212,448

(22) Filed: Aug. 5, 2002

(65) Prior Publication Data

US 2004/0021232 A1 Feb. 5, 2004

(51) Int. Cl.$^7$ .............................................. H01L 23/48
(52) U.S. Cl. ........................ 257/778; 257/738; 438/108; 174/260
(58) Field of Search .................................. 257/780, 778, 257/737, 738, 734; 438/106, 108; 174/52.1, 260, 261

(56) References Cited

U.S. PATENT DOCUMENTS

| | | | | |
|---|---|---|---|---|
| 3,239,719 A | * | 3/1966 | Shower | 361/794 |
| 3,517,278 A | * | 6/1970 | Hager | 361/794 |
| 4,603,345 A | * | 7/1986 | Lee et al. | 357/81 |
| 4,825,284 A | * | 4/1989 | Soga et al. | 357/80 |
| 4,893,172 A | * | 1/1990 | Matsumoto et al. | 357/80 |
| 5,239,448 A | * | 8/1993 | Perkins et al. | 361/764 |
| 5,847,936 A | * | 12/1998 | Forehand et al. | 361/794 |

* cited by examiner

*Primary Examiner*—Kamand Cuneo
*Assistant Examiner*—Lourdes Cruz
(74) *Attorney, Agent, or Firm*—Fitch, Even, Tabin & Flannery

(57) ABSTRACT

A test package for electromigration testing includes a die having a plurality of I/O pads formed on a metal layer, a plurality of traces formed on the die electrically connecting adjacent pairs of the I/O pads, a plurality of bumped interconnects formed on the I/O pads, and a substrate having a plurality of bump-to-bump interconnects formed on a top surface of the substrate adjacent to the die wherein the plurality of bump-to-bump interconnects is electrically coupled to the plurality of bumped interconnects so that the plurality of bumped interconnects is connected in series.

14 Claims, 5 Drawing Sheets

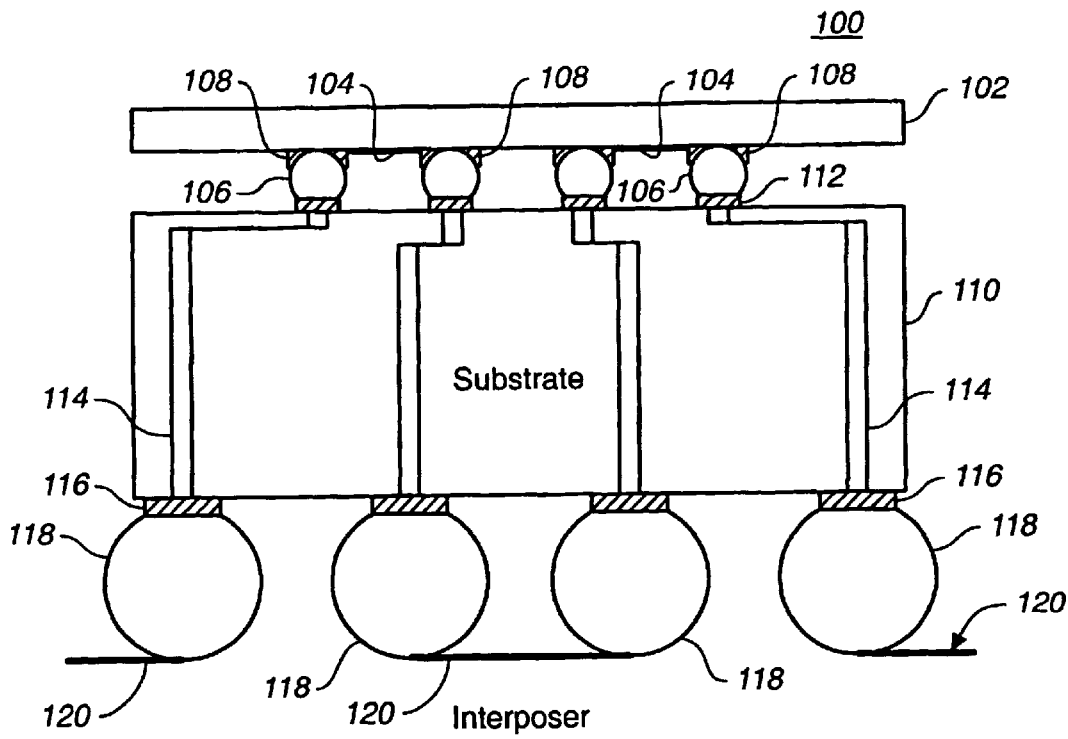
FIG._1 *(PRIOR ART)*
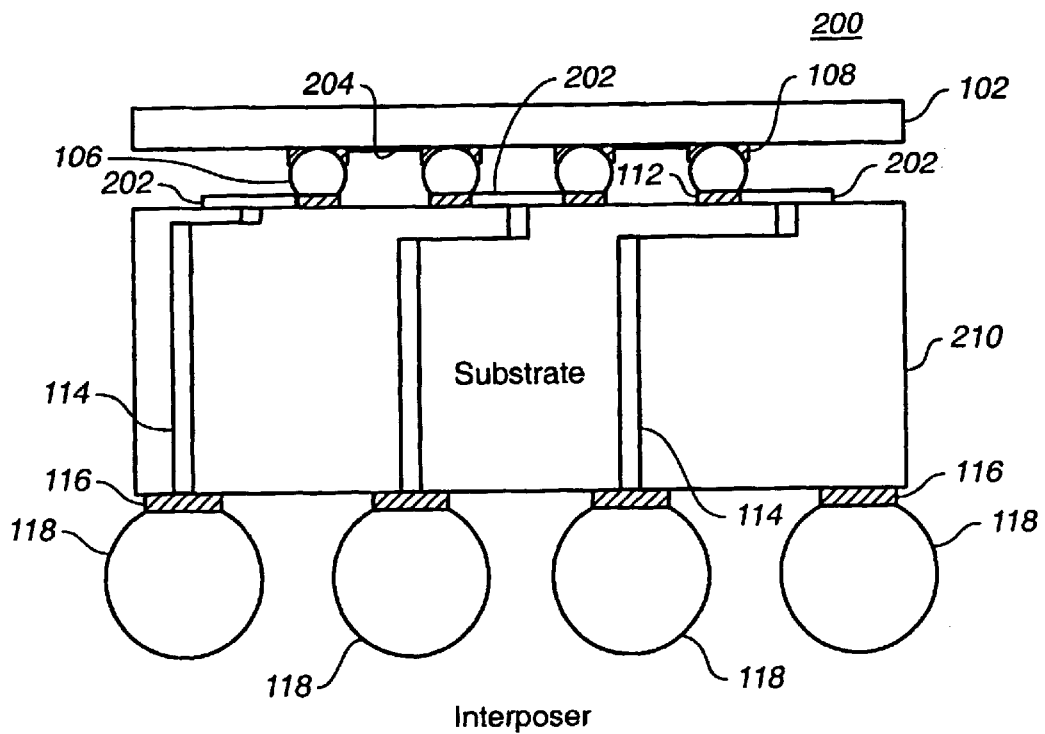
FIG._2

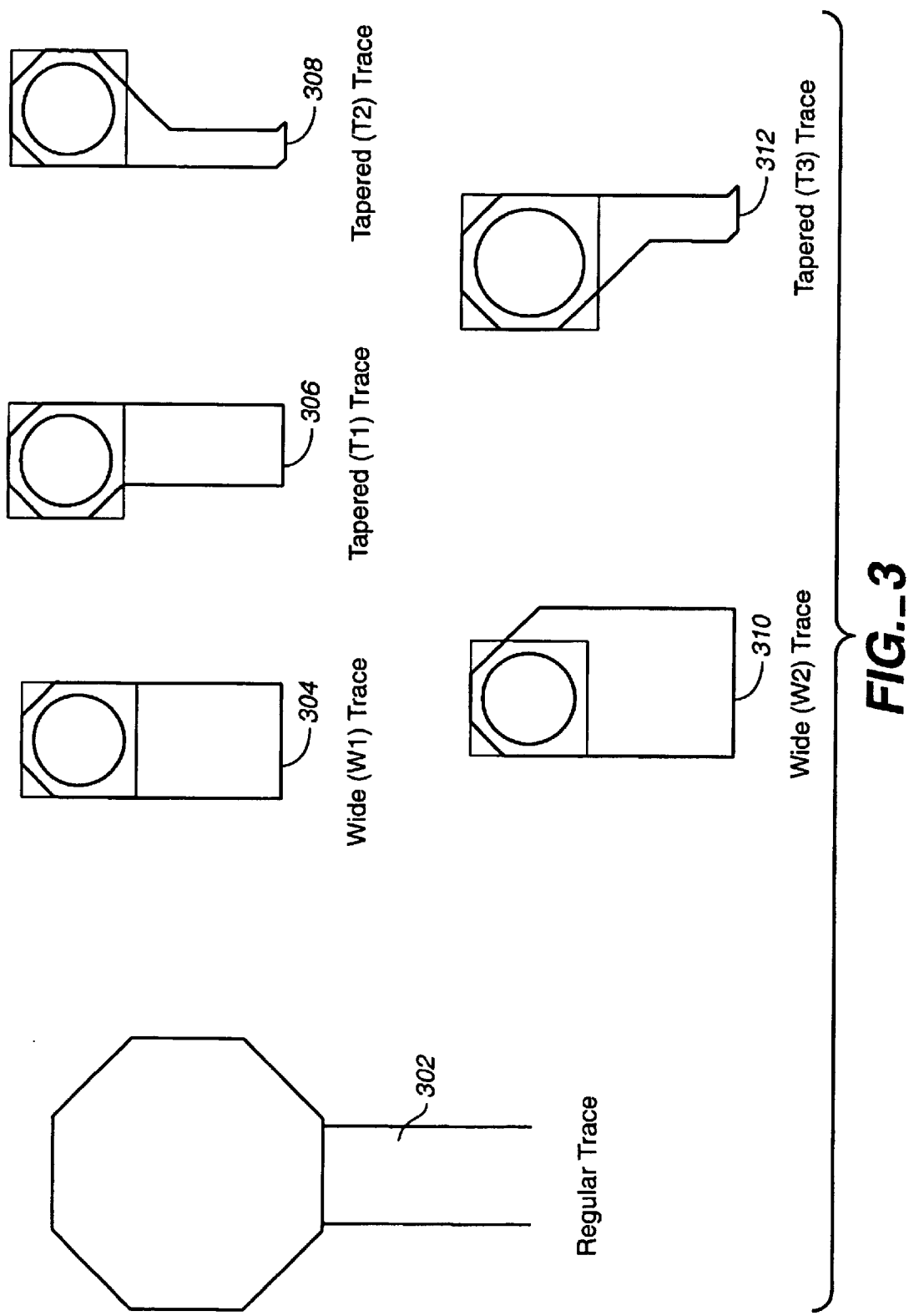

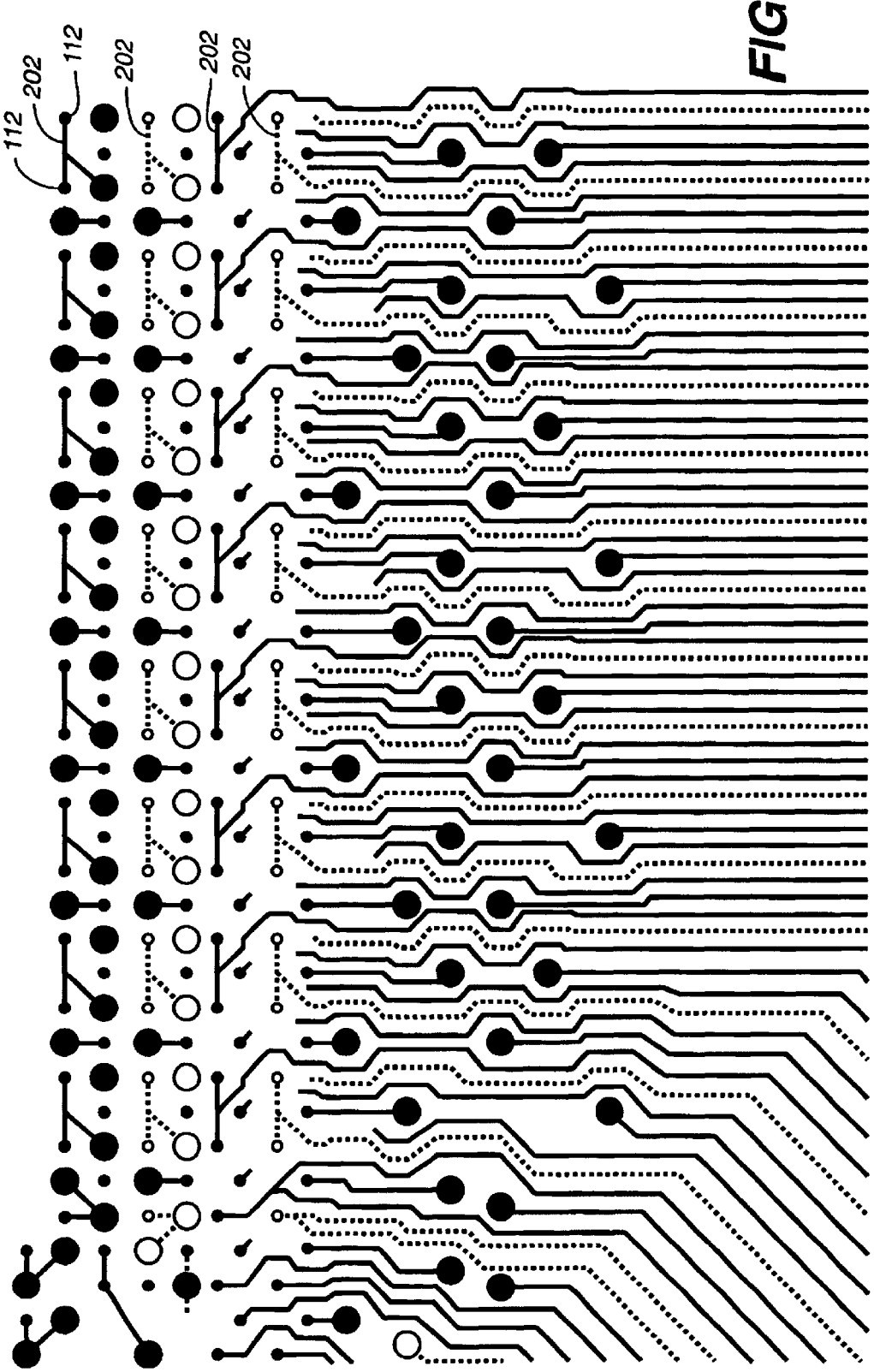
FIG._4

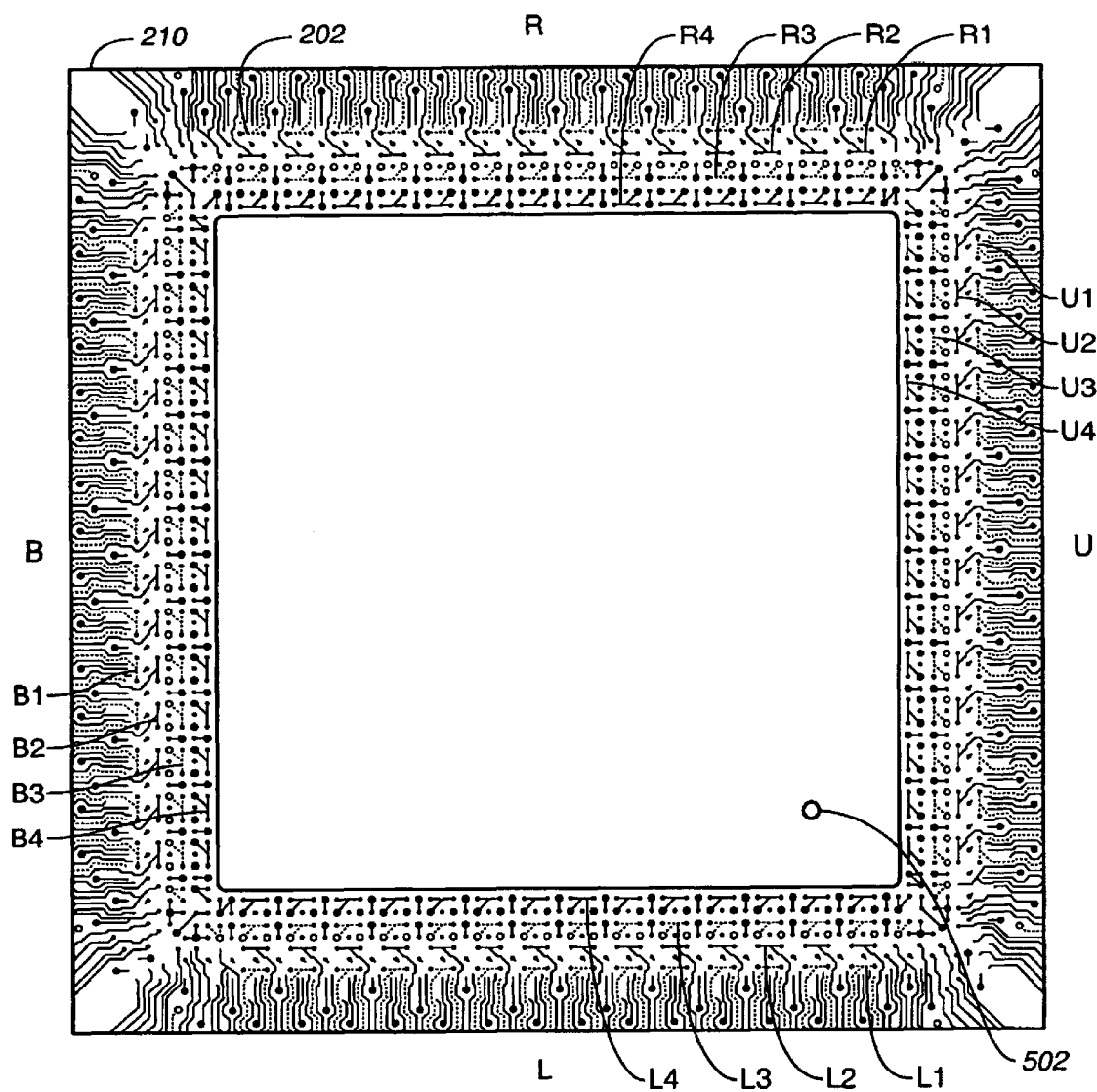
FIG._5

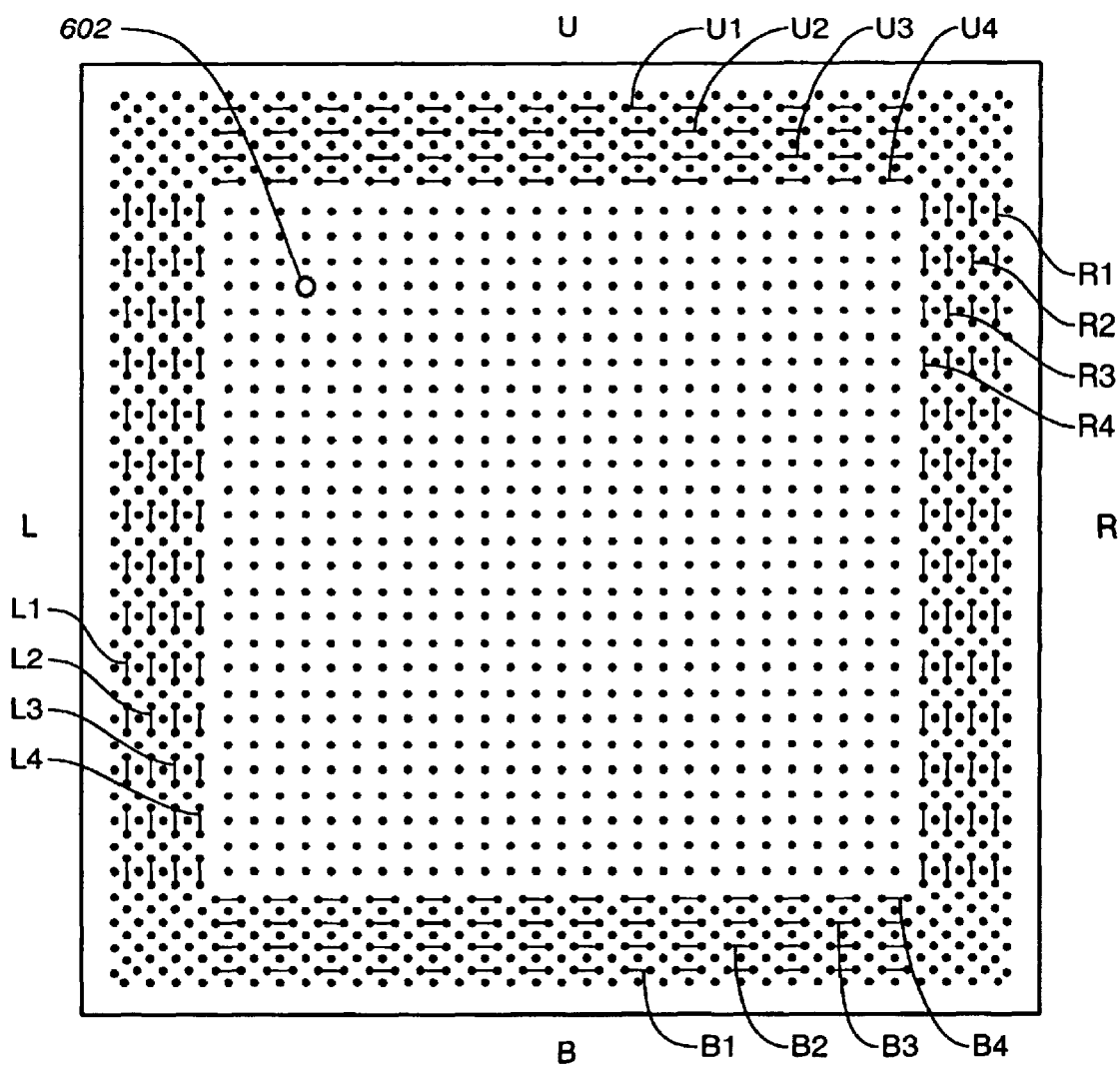
FIG._6

FLIP-CHIP BALL GRID ARRAY PACKAGE FOR ELECTROMIGRATION TESTING

FIELD OF THE INVENTION

The present invention relates generally to the design of flip-chip packages used in the manufacture of integrated circuits. More specifically, but without limitation thereto, the present invention relates to testing for electromigration in a flip-chip ball grid array package.

BACKGROUND OF THE INVENTION

An important issue in microelectronic packaging is reliability. Technologies for microelectronic packaging are developed not only to manufacture microelectronic packages at low cost, but also to ensure that the performance of the microelectronic packages will not deteriorate over their service life. A significant cause of such deterioration problem is electromigration in the interconnects of flip-chip ball grid array (FPBGA) packages. Parameters that influence the mean time to failure (MTTF) of an FPBGA package are material properties, temperature, current density and the physical dimensions, which affect the current density. Accordingly, a need exists for an apparatus and/or method for extending the service life of microelectronic packages.

SUMMARY OF THE INVENTION

In one aspect of the present invention, a package for a flip-chip ball grid array includes a die having a plurality of I/O pads formed on a metal layer, a plurality of traces formed on the die electrically connecting adjacent pairs of the I/O pads, a plurality of bumped interconnects formed on the I/O pads, and a substrate having a plurality of bump-to-bump interconnects formed on a top surface of the substrate adjacent to the die wherein the plurality of bump-to-bump interconnects is electrically coupled to the plurality of bumped interconnects so that the plurality of bumped interconnects is connected in series.

In another aspect of the present invention, a method of making a package for a flip-chip ball grid array includes providing a die having a plurality of I/O pads, forming a plurality of traces on the die electrically connecting adjacent pairs of the I/O pads, forming a plurality of bumped interconnects on the I/O pads, and forming a plurality of bump-to-bump interconnects on a top surface of a substrate adjacent to the die wherein the plurality of bump-to-bump interconnects is electrically coupled to the plurality of bumped interconnects so that the plurality of bumped interconnects is connected in series.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a cross-sectional view of a flip-chip ball grid array test package of the prior art;

FIG. 2 illustrates a cross-sectional view of a flip-chip ball grid array test package according to an embodiment of the present invention;

FIG. 3 illustrates several trace designs that may be used for the die interconnects in the test package of FIG. 2;

FIG. 4 illustrates an enlarged top view of the bump-to-bump interconnects on the package substrate for the flip-chip ball grid array test package of FIG. 2;

FIG. 5 illustrates a top view of the package substrate for the flip-chip ball grid array test package of FIG. 2; and FIG. 6 illustrates a top view of the die for the flip-chip ball grid array test package of FIG. 2.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

One of the limiting factors of the service life of a microelectronic package is electromigration. Electromigration is the mass transport of atoms in die interconnects and solder bumps of an FPBGA package in the presence of an electric current. Since the invention of the first integrated circuits in the 1960's, electromigration has been a major problem. As package size and I/O pad dimensions decrease with higher density technologies, reliability may be compromised if measures are not taken to mitigate electromigration. Also, with the implementation of a metal redistribution layer made of copper instead of aluminum, the maximum current density capability of the metal redistribution layer doubles from, for example, about $4 \times 10^5$ A/cm$^2$ to about $8 \times 10^5$ A/cm$^2$. The higher current density in the metal redistribution layer results in a correspondingly higher current density in the die interconnects and the solder bumps.

In theory, as current passes through the solder bumps, momentum is transferred from electrons to the solder metal atoms, resulting in the migration of the solder metal atoms. The higher the current density, the higher the degree of electromigration. As the solder metal atoms migrate, they leave behind vacancies that coalesce to form voids. The voids decrease the cross-sectional area of the solder bump, increasing the solder bump electrical resistance. The increased electrical resistance of the solder bump results in a higher voltage drop across the solder bump. The voltage drop across the solder bumps continues to increase, ultimately resulting in a malfunction or failure of the integrated circuit.

Recently, it has been discovered in bumped interconnects that electromigration depends on several design parameters. To test a different package for each variation of design parameters would be extremely costly and would require several years of testing. The present invention overcomes this problem by incorporating several design parameters into a single package.

In previous test package designs used by the inventors, several bumped interconnects are connected in series, or "daisy-chain", and the resistance of the chain is monitored during an accelerated test. Each bumped interconnect is typically connected through the substrate ball on the substrate side. The length of the chain is limited by the resistance level that the test instruments can measure. The interconnect from the bump to the ball and back from the ball to the bump contribute significantly to the resistance, therefore the number of bumps that may be connected in series is severely limited. Consequently, an insufficient sample of bumps may be tested.

In one embodiment of the present invention, a test package includes a plurality of bumped interconnect chains formed on a die. Each of the bumped interconnect chains contains a selected number of bumped interconnects connected in adjacent pairs by die traces, typically 10 or more. The bumped interconnects and the interconnecting die traces are preferably arranged along a common line so that failure analysis may be performed in a single cross-section. In contrast to the arrangement shown in FIG. 1, the bumped interconnects in FIG. 2 are daisy-chained through the interconnects on the top surface layer of the package substrate immediately adjacent to the bumped interconnects. Optionally, one or more chains of bumped interconnects may be connected through the package substrate and across the bottom of package substrate as shown in FIG. 1. On the die side, the bumped interconnects are daisy-chained through traces on a top layer of the die. An important feature of the present invention is the interconnecting of the bumped interconnects in series by bump-to-bump interconnects formed on the top side of the substrate, thereby increasing sensitivity of the resistance monitoring by excluding the extraneous resistance of the bump-to-ball interconnects from the measurements. Each of the chains has an associated set of built-in values for several parameters on the die or on the substrate. Examples of the parameters are bump diameter, trace width, passivation opening width, and trace design. Some of the chains have differing I/O pad sizes and corresponding passivation opening widths. Some of the chains have the same passivation opening width, but different trace designs. Some of the chains may differ, for example, only in the width of the bump-to-bump interconnect on the substrate. The parameters are not limited to those in this example, and other parameters may also be included to practice the present invention within the scope of the appended claims.

FIG. 1 illustrates a cross-sectional view of a flip-chip ball grid array test package 100 of the prior art. Shown in FIG. 1 are a die 102, die interconnects 104, bumped interconnects 106, I/O pads 108, a package substrate 110, substrate bump pads 112, bump-to-ball interconnects 114, substrate ball pads 116, solder balls 118, and ball-to-ball interconnects 120.

In FIG. 1, the bumped interconnects 106 are formed on passivation openings on the I/O pads 108 of the die 102 and connected in series by the die interconnects (traces) 104, through the bump-to-ball interconnects 114 formed in the package substrate 110, and finally across the bottom surface of the package substrate 110 through the solder balls 118 formed on the substrate ball pads 116 to the ball-to-ball interconnects 120. The ball-to-ball interconnects 120 are typically formed on an interposer (not shown) used for making connections to the test package during testing. Typically an underfill is added between the die 102 and the package substrate 110, however the underfill is omitted from the figure to simplify the drawing.

FIG. 2 illustrates a cross-sectional view of a flip-chip ball grid array test package 200 according to an embodiment of the present invention. Shown in FIG. 2 are a die 102, die traces 204, bumped interconnects 106, I/O pads 108, a package substrate 210, substrate bump pads 112, bump-to-bump interconnects 202 on the package substrate 210, bump-to-ball interconnects 114, substrate ball pads 116, and solder balls 118.

In FIG. 2, the ball-to-ball interconnects 120 of FIG. 1 are replaced by the bump-to-bump interconnects 202 formed on the top surface of the package substrate 210 immediately adjacent to the bumped interconnects 106. An underfill may be added between the die 102 and the package substrate 210, however the underfill is omitted from the figure to simplify the drawing. The bumped interconnects 106 have a diameter of about 130 microns and a height of about 100 microns. The bump-to-bump interconnects 202 are much shorter than the path through the bump-to-ball interconnects 114 and the ball interconnects 120, thus reducing the resistance of the connections between the bumped interconnects 106. The bump-to-ball interconnects 114 are connected individually to the bump-to-bump interconnects 202 that connect adjacent pairs of bumped interconnects 106. The reduced resistance of the connections between the bumped interconnects 106 increases the sensitivity of resistance measurements to changes in resistance resulting from electromigration, facilitating more accurate testing.

The design parameters for each chain include I/O pad diameter, trace width, passivation opening width, and trace design. The passivation openings are made in the passivation layer over the I/O pads 108 according to well known techniques for making electrical contact with the bumped interconnects 106. A typical value for the substrate I/O pad diameter is about 80 microns, for the trace width, about 35 or 40 microns, and for the passivation opening, about 40, 50, 60, or 70 microns. The shape of the trace connecting the I/O pads 108 on the die 102 may be varied in each chain to test the effect of various trace designs on the degree of electromigration.

FIG. 3 illustrates several trace designs that may be used for the die interconnects 204 in the test package of FIG. 2 to minimize current crowding and associated electromigration at the bump/pad interface on the die 102. Shown in FIG. 3 are a regular trace 302, a wide (W1) trace 304, a tapered (T1) trace 306, a tapered (T2) trace 308, a wide (W2) trace 310, and a tapered (T3) trace 312.

The regular trace 302 has a width approximately equal to one side of the generally octagonally-shaped I/O pads 108. Alternatively, other shapes may be used for the I/O pads 108 according to well known techniques, however, a polygonal shape is preferred because it facilitates the alignment in the exposure tool.

The wide (W1) trace 304 and the wide (W2) trace 310 provide the most reduction in current crowding compared to the standard trace 302. In the wide (W1) trace 304, the trace width about as wide as the I/O pad 108, and in the wide (W2) trace 310, the trace is wider than the I/O pad 108.

The tapered (T1) trace 306 provides substantial reduction in current crowding compared to the standard trace 302. In this trace design, the trace width is about two-thirds as wide as the I/O pad 108.

The tapered (T2) trace 308 and the tapered (T3) trace 312 provide moderate reduction in current crowding compared to the standard trace 302. In these trace designs, the trace width is about one-third as wide as the I/O pad 108.

The relative reduction in current crowding for the trace designs described above was determined by finite element analysis. These trace designs may be incorporated into the test package of the present invention to establish a correlation between simulation and experiments.

FIG. 4 illustrates an enlarged top view of the bump-to-bump interconnects 202 on the package substrate 210 for the flip-chip ball grid array test package of FIG. 2. Also shown in FIG. 4 are substrate bump pads 112.

In FIG. 4, the bump-to-bump interconnects 202 connect adjacent pairs of bumped interconnects 106 on the die 102 of FIG. 2 in series. The arrangement of the bump-to-bump interconnects 202 at the top metal layer of the die 102 minimizes the resistance of the connections between the bumped interconnects 106. The arrangement of the traces in the same row as the bumped interconnects 106 facilitates the failure analysis. The connections between the bump-tobump interconnects 202 and the bump-to-ball interconnects 114 provide the capability of electrically isolating individual adjacent connected pairs of bumped interconnects 106. In this example, there are four rows of bump-to-bump interconnects 202 and substrate bump pads 112.

FIG. 5 illustrates a top view of the package substrate 210 for the flip-chip ball grid array test package of FIG. 2. Shown in FIG. 5 are the bump-to-bump interconnects 202, outer chain rows U1, U2, R1, R2, B1, B2, L1, and L2, inner chain rows U3, U4, R3, R4, B3, B4, L3, and L4, and a location of a missing bump 502. The location of the missing bump 502 is used to locate the corner of the substrate where pin 1 of the die is connected.

Each of the chain rows U1, U2, U3, U4, R1, R2, R3, R4, B1, B2, B3, B4, L1, L2, L3, and L4 includes a group of the bump-to-bump interconnects 202 that interconnect adjacent pairs of bumped interconnects 106 when the package substrate 210 is bonded to the die 102 in FIG. 2.

An example of how selected values of various design parameters may be built into the test package of FIG. 2 is illustrated in Table 5 below.

TABLE 5

| CHAIN # | SUBSTRATE PAD DIAMETER/TRACE WIDTH (MICRONS) | DAISY-CHAIN THROUGH | DIE PASSIVATION OPENING (MICRONS) | TRACE DESIGN |
|---|---|---|---|---|
| U1 | 80/35 | SUBSTRATE | 50 | REG |
| U2 | 80/35 | SUBSTRATE | 40 | REG |
| R1 | 80/35 | SUBSTRATE | 70 | T3 |
| R2 | 80/35 | SUBSTRATE | 50 | T3 |
| B1 | 80/35 | BOARD | 70 | REG |
| B2 | 80/45 | SUBSTRATE | 70 | REG |
| L1 | 80/35 | SUBSTRATE | 70 | REG |
| L2 | 80/35 | SUBSTRATE | 70 | REG |
| U3 | 80/35 | SUBSTRATE | 50 | W1 |
| U4 | 80/35 | SUBSTRATE | 40 | W1 |
| R3 | 80/35 | SUBSTRATE | 70 | T2 |
| R4 | 80/35 | SUBSTRATE | 50 | T2 |
| B3 | 80/40 | SUBSTRATE | 40 | REG |
| B4 | 80/40 | SUBSTRATE | 70 | W1 |
| L3 | 80/35 | SUBSTRATE | 70 | W1 |
| L4 | 80/35 | SUBSTRATE | 60 | W1 |

In Table 5, the board through which the reference chain is connected is an interposer used for making connections to the test package during testing. In this example, all chains except for the reference chain are connected on the top surface of the package substrate 210 by the bump-to-bump interconnects 202. The trace design abbreviations corresponding to the trace designs in FIG. 3 are REG (regular trace 302), W1 (wide (W1) trace 304), T2 (tapered (T2) trace 308), and T3 (tapered (T3) trace 312).

FIG. 6 illustrates a top view of the die interconnects 204 and the bumped interconnects 106 of the die 102 for the flip-chip ball grid array test package of FIG. 2. The die interconnects 204 connect the bumped interconnects 106 in series. A location of a missing bump 602 is used to find the corner of the die where pin 1 is located.

Other variations and combinations of design parameters may be incorporated into various embodiments of the present invention to suit specific applications. The same test package illustrated in FIG. 2 may be used to include various combinations of parameter values to accelerate electromigration testing and to find the parameter values that satisfy the service life requirements for a flip-chip ball grid array integrated circuit.

In addition, the wafer may be bumped by using various under bump metallurgy (UBM) diameters and various UBM stacks, for example, Al/Ni(V)/Cu, Ti/Cu/Ni, and so on, according to various bumping techniques, for example, plating, screen printing, and so on. After packaging, the FPBGA packages may be tested under identical conditions to test the effect of these process parameters.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A package for a flip-chip ball grid array comprising:
a die having a plurality of I/O pads formed on a metal layer;
a plurality of traces formed on the die electrically connecting adjacent pairs of the I/O pads;
a plurality of bumped interconnects formed on the I/O pads; and
a substrate having a plurality of bump-to-bump interconnects formed on a top surface of the substrate adjacent to the die wherein the plurality of bump-to-bump interconnects is electrically coupled to the plurality of bumped interconnects so that the plurality of bumped interconnects is connected in series.

2. The package of claim 1 further comprising:
a plurality of solder balls formed on a bottom surface of the substrate; and
a plurality of substrate interconnects formed between the top surface and the bottom surface of the substrate electrically connecting the plurality of bump-to-bump interconnects individually to the solder balls.

3. The package of claim 1 further comprising a plurality of passivation openings formed in a passivation layer over the I/O pads wherein the passivation openings have a selected diameter that is one of about 40 microns, 50 microns, 60 microns, and 70 microns.

4. The package of claim 1 wherein the traces on the die have a design that is one of a standard trace, a wide trace, a straight tapered trace, a short tapered trace, an extra wide trace, and a long tapered trace.

5. The package of claim 1 wherein the bumped interconnects have a width of about 130 microns and a height of about 100 microns.

6. The package of claim 1 wherein the plurality of bump-to-bump interconnects have a selected width that is one of about 35 microns and 40 microns.

7. The package of claim 1 further comprising:
a second plurality of bumped interconnects formed on a second plurality of I/O pads formed on the die;
a plurality of solder balls formed on a bottom surface of the substrate;
a plurality of substrate interconnects formed between the top surface and the bottom surface of the substrate wherein the plurality of substrate interconnects electrically couple the second plurality of bumped interconnects to the plurality of solder balls, respectively; and
a plurality of ball-to-ball interconnects electrically coupling adjacent pairs of the plurality of solder balls so that the plurality of bumped interconnects is connected in series.

8. A method of making a package for a flip-chip ball grid array comprising:
providing a die having a plurality of I/O pads formed on a metal layer;
forming a plurality of traces on the die electrically connecting adjacent pairs of the I/O pads;
forming a plurality of bumped interconnects on the I/O pads; and
forming a plurality of bump-to-bump interconnects on a top surface of a substrate adjacent to the die wherein the plurality of bump-to-bump interconnects is electrically coupled to the plurality of bumped interconnects so that the plurality of bumped interconnects is connected in series.

9. The method of claim 8 further comprising:
forming a plurality of solder balls on a bottom surface of the substrate; and
forming a plurality of substrate interconnects between the top surface and the bottom surface of the substrate electrically connecting the plurality of bump-to-bump interconnects individually to the solder balls.

10. The method of claim 8 wherein the I/O pads have a selected diameter of about 80 microns.

11. The method of claim 8 wherein the traces have a design that is one of a standard trace, a wide trace, a straight tapered trace, a short tapered trace, an extra wide trace, and a long tapered trace.

12. The method of claim 8 wherein the bumped interconnects have a diameter of about 130 microns and a eight of about 100 microns.

13. The method of claim 8 wherein the plurality of bump-to-bump interconnects on the substrate have a selected width that is one of about 35 microns and 40 microns.

14. The method of claim 8 further comprising:
forming a second plurality of bumped interconnects on a second plurality of passivation openings formed on the die;
forming a plurality of solder balls on a bottom surface of the substrate;
forming a plurality of substrate interconnects between the top surface and the bottom surface of the substrate wherein the plurality of substrate interconnects electrically couple the second plurality of bumped interconnects to the plurality of solder balls, respectively; and
forming a plurality of ball-to-ball interconnects electrically coupling adjacent pairs of the plurality of solder balls so that the plurality of bumped interconnects is connected in series.

* * * * *